United States Patent
Pourkhaatoun et al.

(10) Patent No.: US 9,197,255 B2
(45) Date of Patent: Nov. 24, 2015

(54) RF TRANSMITTER WITH AVERAGE POWER TRACKING AND METHODS FOR USE THEREWITH

(71) Applicant: BROADCOM CORPORATION, Irvine, CA (US)

(72) Inventors: Mohsen Pourkhaatoun, Laguna Niguel, CA (US); Philippe Riondet, Irvine, CA (US); Alireza Tarighat Mehrabani, Irvine, CA (US); Vipin Kumar Aggarwal, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 111 days.

(21) Appl. No.: 14/032,688

(22) Filed: Sep. 20, 2013

(65) Prior Publication Data

US 2015/0072632 A1 Mar. 12, 2015

Related U.S. Application Data

(60) Provisional application No. 61/876,931, filed on Sep. 12, 2013.

(51) Int. Cl.
*H04B 1/04* (2006.01)
*H03F 1/02* (2006.01)
*H03F 3/195* (2006.01)
*H03F 3/24* (2006.01)

(52) U.S. Cl.
CPC ............ *H04B 1/0458* (2013.01); *H03F 1/0238* (2013.01); *H03F 3/195* (2013.01); *H03F 3/245* (2013.01); *H04B 2001/0416* (2013.01); *H04B 2001/0433* (2013.01)

(58) Field of Classification Search
USPC .................. 455/91, 115.1, 126, 127.1, 127.2, 455/127.3, 127.5, 129; 330/129, 281, 282, 330/297
See application file for complete search history.

(56) References Cited

U.S. PATENT DOCUMENTS

| | | | |
|---|---|---|---|
| 7,440,731 B2* | 10/2008 | Staudinger et al. | 455/91 |
| 2008/0026710 A1* | 1/2008 | Buckley | 455/127.5 |
| 2014/0273897 A1* | 9/2014 | Drogi et al. | 455/127.3 |

* cited by examiner

*Primary Examiner* — Thanh Le
(74) *Attorney, Agent, or Firm* — Garlick & Markison; Bruce E. Stuckman

(57) ABSTRACT

A RF transmitter includes a power amplifier that generates a transmit signal modulated with outbound data for transmission to a remote communication device via an antenna section. A supply voltage to power the power amplifier is adjusted based on an average power tracking signal. A reflected power from the antenna section is measured. The average power tracking signal is adjusted based on the reflected power to compensate for the changes in impedance of the antenna section and to maintain a desired linearity.

20 Claims, 6 Drawing Sheets

RF TRANSMITTER WITH AVERAGE POWER TRACKING AND METHODS FOR USE THEREWITH

CROSS REFERENCE TO RELATED PATENTS

The present U.S. Utility Patent Application claims priority pursuant to 35 U.S.C. §119(e) to U.S. Provisional Patent Application No. 61/876,931, entitled RF TRANSMITTER WITH AVERAGE POWER TRACKING AND METHODS FOR USE THEREWITH, filed Sep. 12, 2013, which is hereby incorporated herein by reference in its entirety and made part of the present U.S. Utility Patent Application for all purposes.

BACKGROUND

1. Technical Field

Various embodiments relate generally to wireless communication and more particularly to communication devices with adjustable power to power amplifiers that support wireless communications.

2. Description of Related Art

Communication systems are known to support wireless and wireline communications between wireless and/or wireline communication devices. Such communication systems range from national and/or international cellular telephone systems to the Internet to point-to-point in-home wireless networks to radio frequency identification (RFID) systems. Each type of communication system is constructed, and hence operates, in accordance with one or more communication standards. For instance, wireless communication systems may operate in accordance with one or more standards including, but not limited to, RFID, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Wireless communications occur within licensed or unlicensed frequency spectrums. For example, wireless local area network (WLAN) communications occur within the unlicensed Industrial, Scientific, and Medical (ISM) frequency spectrum of 900 MHz, 2.4 GHz, and 5 GHz. While the ISM frequency spectrum is unlicensed there are restrictions on power, modulation techniques, and antenna gain. Another unlicensed frequency spectrum is the millimeter wave V-band of 55-64 GHz.

BRIEF DESCRIPTION OF THE SEVERAL VIEWS OF THE DRAWING(S)

DETAILED DESCRIPTION

Figure 1:
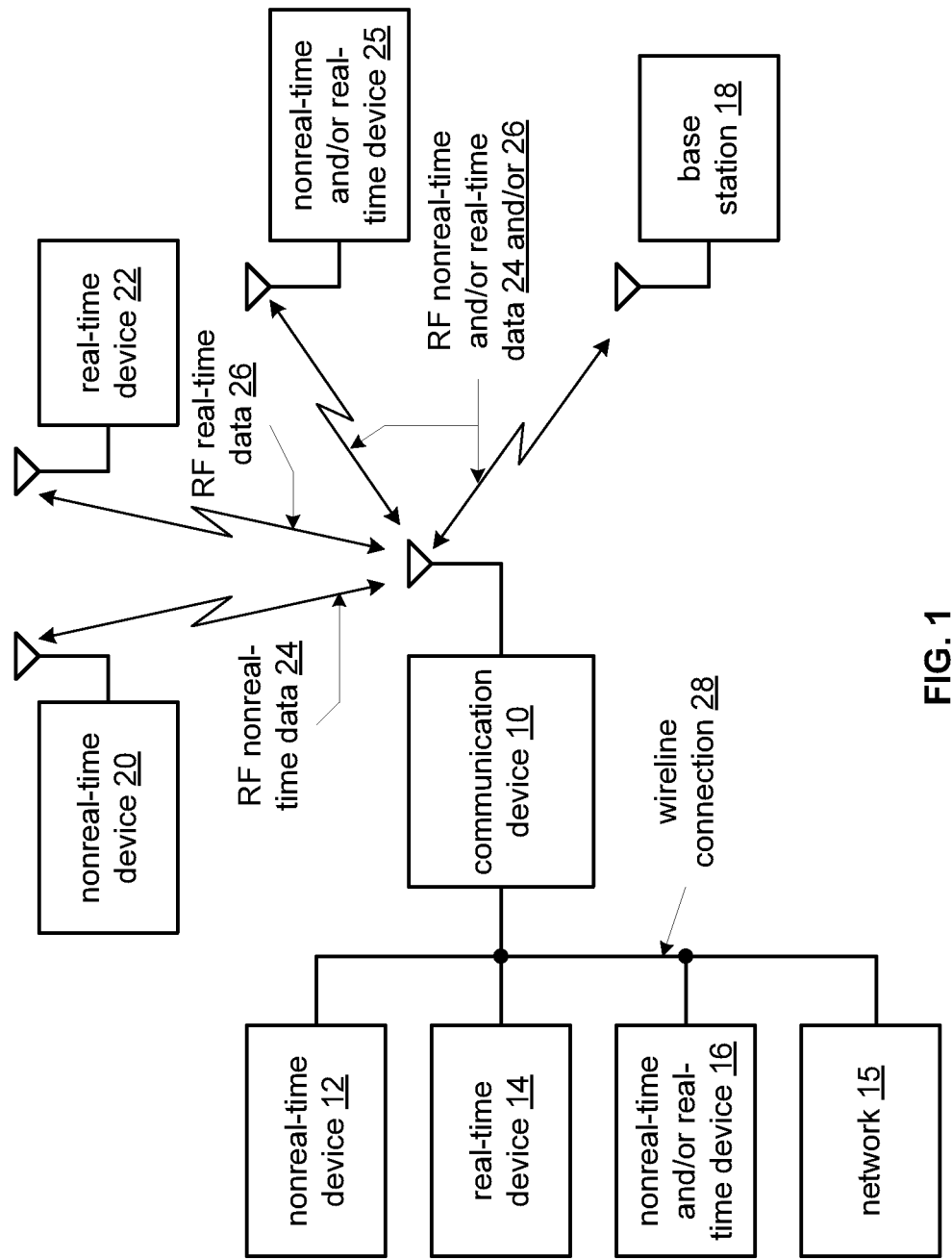
FIG. 1 is a schematic block diagram of an embodiment of a wireless communication system.

FIG. 1 is a schematic block diagram of an embodiment of a communication system. In particular a communication system is shown that includes a communication device 10 that communicates real-time data 26 and/or non-real-time data 24 wirelessly with one or more other devices such as base station 18, non-real-time device 20, real-time device 22, and non-real-time and/or real-time device 25. In addition, communication device 10 can also optionally communicate over a wireline connection with network 15, non-real-time device 12, real-time device 14, non-real-time and/or real-time device 16.

In an embodiment the wireline connection 28 can be a wired connection that operates in accordance with one or more standard protocols, such as a universal serial bus (USB), Institute of Electrical and Electronics Engineers (IEEE) 488, IEEE 1394 (Firewire), Ethernet, small computer system interface (SCSI), serial or parallel advanced technology attachment (SATA or PATA), or other wired communication protocol, either standard or proprietary. The wireless connection can communicate in accordance with a wireless network protocol such as WiHD, WiGig, NGMS, IEEE 802.11a, ac, ad, b, g, n, or other 802.11 standard protocol, Bluetooth, Ultra-Wideband (UWB), WIMAX, or other wireless network protocol, a wireless telephony data/voice protocol such as Global System for Mobile Communications (GSM), General Packet Radio Service (GPRS), Enhanced Data Rates for Global Evolution (EDGE), Long term Evolution (LTE), Personal Communication Services (PCS), or other mobile wireless protocol or other wireless communication protocol, either standard or proprietary. Further, the wireless communication path can include multiple transmit and receive antennas, as well as separate transmit and receive paths that use single carrier modulation to bi-directionally communicate data to and from the communication device 10.

Communication device 10 can be a mobile phone such as a cellular telephone, smartphone, a local area network device, personal area network device or other wireless network device, a personal digital assistant, tablet, game console, personal computer, laptop computer, or other device that performs one or more functions that include communication of voice and/or data via the wireless communication path. Further communication device 10 can be an access point, base station or other network access device that is coupled to a network 15 such as the Internet or other wide area network, either public or private, via wireline connection 28. In an embodiment, the real-time and non-real-time devices 12, 14, 16, 20, 22 and 25 can be personal computers, laptops, PDAs, mobile phones, such as cellular telephones, devices equipped with wireless local area network or Bluetooth transceivers, FM tuners, TV tuners, digital cameras, digital camcorders, or other devices that either produce, process or use audio, video signals or other data or communications.

In operation, the communication device includes one or more applications that include voice communications such as standard telephony applications, voice-over-Internet Protocol (VoIP) applications, local gaming, Internet gaming, email, instant messaging, multimedia messaging, web browsing, audio/video recording, audio/video playback, audio/video downloading, playing of streaming audio/video, office applications such as databases, spreadsheets, word processing, presentation creation and processing and other voice and data applications. In conjunction with these applications, the real-time data 26 includes voice, audio, video and multimedia applications including Internet gaming, etc. The non-real-time data 24 includes text messaging, email, web browsing, file uploading and downloading, etc.

In an embodiment, the communication device 10 includes one or more transceivers having average power tracking (APT) to vary the power supply to an RF power amplifier (PA)

in order to reduce the PA power consumption, e.g. the PA current. In this fashion, the power supplied to PA (APT level) can be adjusted based on the required nonlinearity and the desired output power. In particular, the PA is designed to operate under a certain load impedance to guarantee its best performance. However, under antenna impedance mismatch (a person touching the phone or other objects in close proximity to the antenna), the transmitter's performance (delivered power, efficiency, linearity) can be significantly degraded. Under such conditions, the APT responds by adjusting the power supply to the PA based on the antenna impedance to maintain linearity. The APT feature described above will be presented in conjunction with one or more optional features or functions of the various embodiments that are described in greater detail in association with FIGS. 2-6 that follow.

Figure 2:
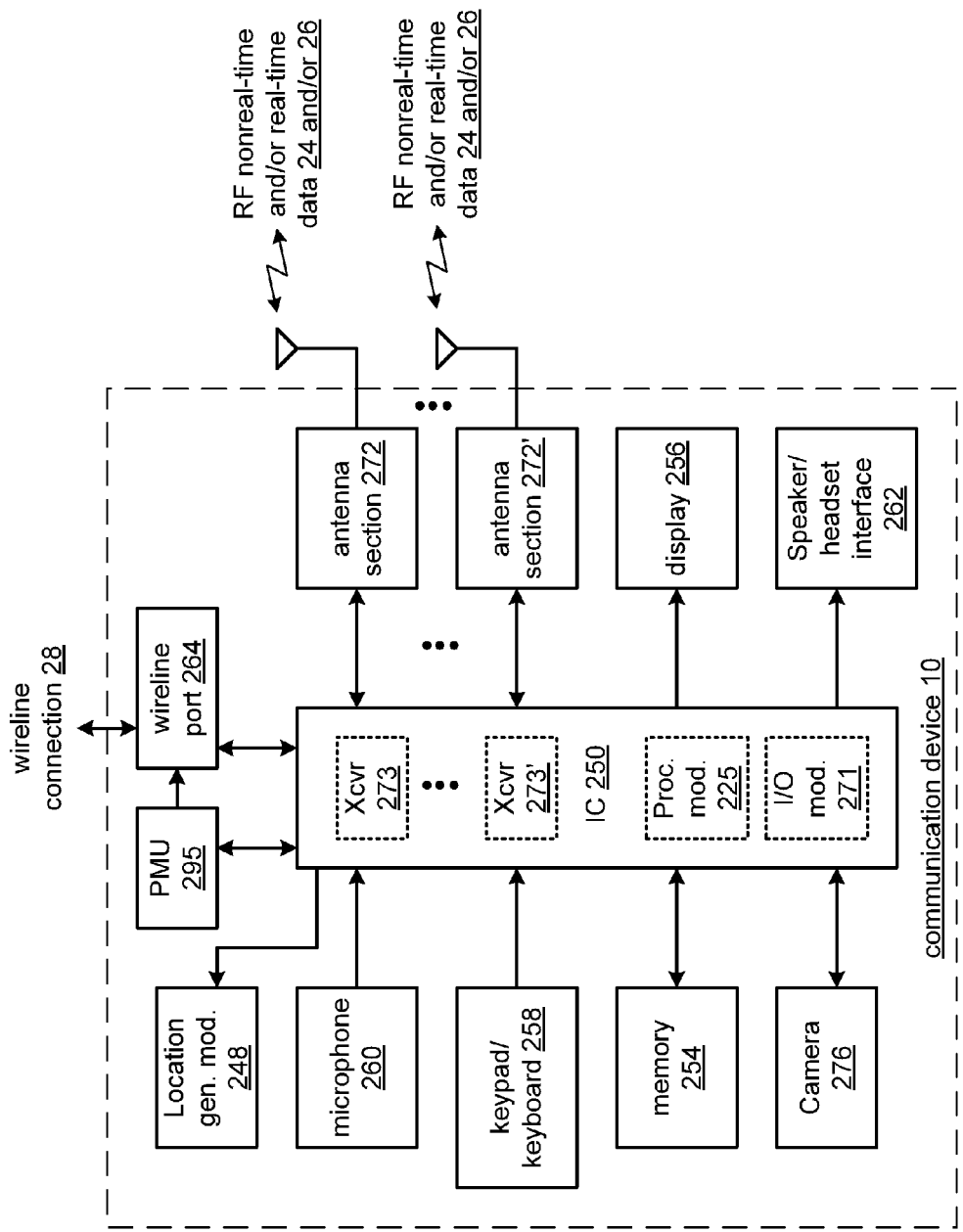
FIG. 2 is a schematic block diagram of an embodiment of a communication device 10.

FIG. 2 is a schematic block diagram of an embodiment of a communication device 10. In particular, integrated circuit (IC) 250 is shown that implements communication device 10 in conjunction with microphone 260, keypad/keyboard 258, memory 254, speaker/headset interface 262, display 256, camera 276, antenna sections 272 . . . 272', and wireline port 264. In operation, RF IC 250 includes a plurality of wireless transceivers such as transceivers 273, 273' . . . having RF and baseband modules for sending and receiving data such as RF real-time data 26 and non-real-time data 24 and transmitting via antenna sections 272 . . . 272'. Each antenna section 272 . . . 272' can include an impedance matching network and an antenna, such as a fixed antenna, a single-input single-output (SISO) antenna, a multi-input multi-output (MIMO) antenna, a diversity antenna system, an antenna array that allows the beam shape, gain, polarization or other antenna parameters to be controlled or other antenna configuration.

In addition, IC 250 includes input/output module 271 that includes the appropriate interfaces, drivers, encoders and decoders for communicating via the wireline connection 28 via wireline port 264, an optional memory interface for communicating with off-chip memory 254, a codec for encoding voice signals from microphone 260 into digital voice signals, a keypad/keyboard interface for generating data from keypad/keyboard 258 in response to the actions of a user, a display driver for driving display 256, such as by rendering a color video signal, text, graphics, or other display data, and an audio driver such as an audio amplifier for driving speaker 262 and one or more other interfaces, such as for interfacing with the camera 276 or the other peripheral devices.

Power management circuit (PMU) 295 includes one or more DC-DC converters, voltage regulators, current regulators or other power supplies for supplying the IC 250 and optionally the other components of communication device 10 and/or its peripheral devices with supply voltages and or currents (collectively power supply signals) that may be required to power these devices and further for optionally generating one or more feedback signals to monitor the power or current consumption of the power supply signals that are generated. Power management circuit 295 can operate from one or more batteries, line power, an inductive power received from a remote device, a piezoelectric source that generates power in response to motion of the integrated circuit and/or from other power sources, not shown. In particular, power management unit 295 can selectively supply power supply signals of different voltages, currents or current limits or with adjustable voltages, currents or current limits in response to power mode signals and/or APT signals received from the IC 250. While shown as an off-chip module, PMU 295 can be alternatively implemented as an on-chip circuit.

In addition, IC 250 may include an location generation module 248 that generates location or motion parameters based on the location or motion of the device such as a longitude, latitude, altitude, address, velocity, velocity vector, acceleration (including deceleration), and/or other location or motion parameter. Location generation module 248 can include a global positioning system (GPS) receiver, one or more accelerometers, gyroscopes or positioning sensors, a device that operates via triangulation data received via the network, or other location generation devices that generate or receive such location or motion parameters.

In an embodiment, the RF transceivers 273 . . . 273' generate outbound RF signals from outbound data and generate inbound data from inbound RF signals to communicate contemporaneously with a remote communication device in accordance with a plurality of differing protocols such as Bluetooth, LTE, WLAN, WiGig and/or other wireless connection protocols. This radio design provides an opportunity for more energy-efficient transmission of bits across multiple independent or concurrent radio paths.

In an embodiment, one or more transceivers 273 . . . 273' include average power tracking (APT) to vary the power supply to an RF power amplifier (PA) in order to reduce the PA power consumption, i.e. the PA current as discussed in conjunction with FIG. 1.

In an embodiment, the IC 250 is a system on a chip integrated circuit that includes at least one processing device. Such a processing device, for instance, processing module 225, may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices that are either on-chip or off-chip such as memory 254. Such a memory device may be a read-only memory, random access memory, volatile memory, non-volatile memory, static memory, dynamic memory, flash memory, and/or any device that stores digital information. Note that when the IC 250 implements one or more of its functions via a state machine, analog circuitry, digital circuitry, and/or logic circuitry, the associated memory storing the corresponding operational instructions for this circuitry is embedded with the circuitry comprising the state machine, analog circuitry, digital circuitry, and/or logic circuitry.

Also note that while certain modules of communication device 10 are shown to be included on IC 250 while others are not, IC 250 is shown for illustrative purposes and may include more or less of the modules of communication device 10, depending on the particular implementation. Further, communication device 10 can include additional modules or fewer modules than those specifically shown. In operation, the IC 250 executes operational instructions that implement one or more of the applications (real-time or non-real-time) attributed to communication devices 10 as discussed above and in conjunction with FIG. 1.

Figure 3:
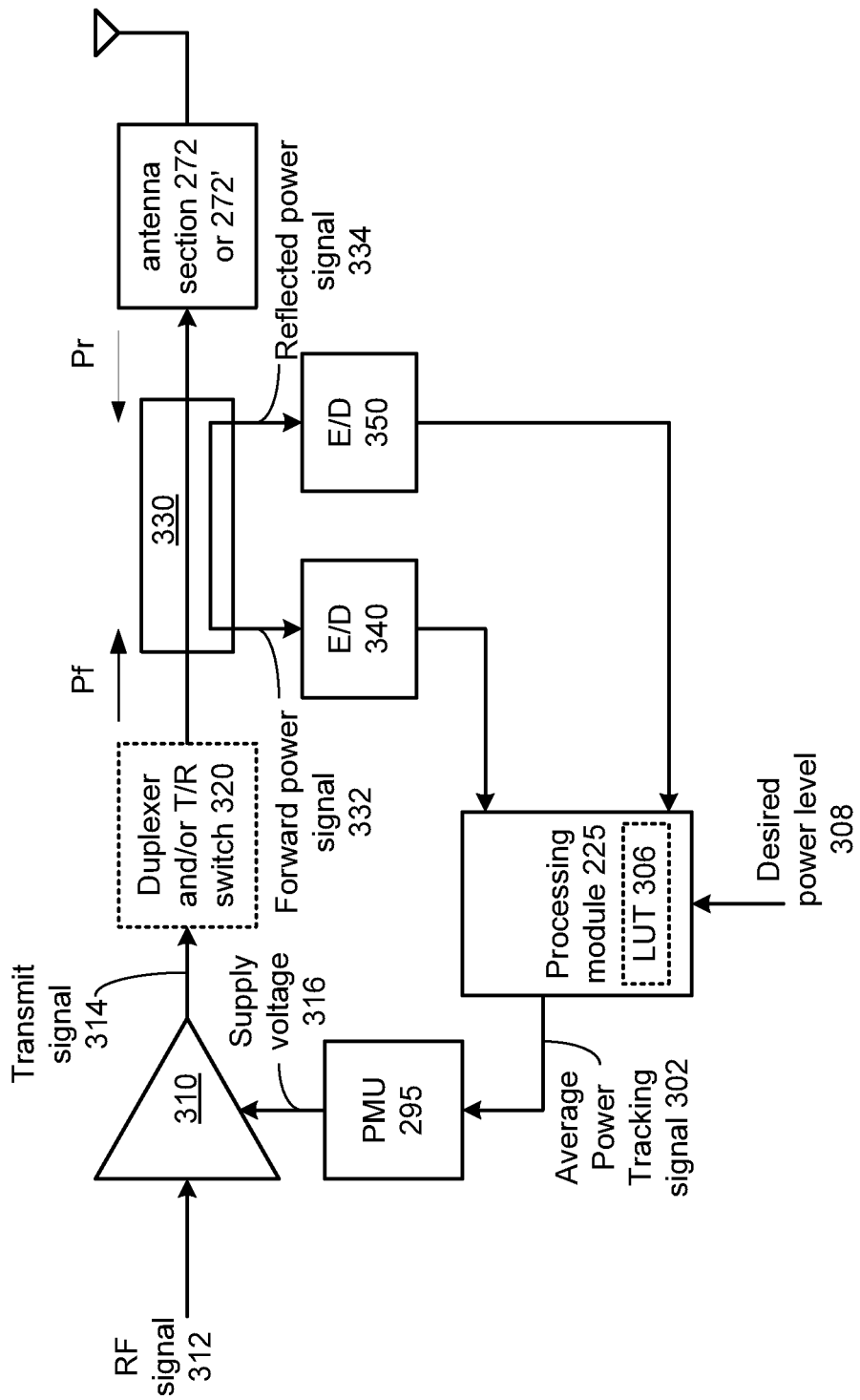
FIG. 3 is a schematic block diagram of an embodiment of an RF transmitter.

FIG. 3 is a schematic block diagram of an embodiment of an RF transmitter. In particular, portions of an RF transmitter of any of the transceivers 273 . . . 273' is presented in conjunction with other components of communication device 10. The RF transmitter includes a power amplifier 310 that generates a transmit signal 314 from an RF signal 312 that is modulated with outbound data. The power amplifier 310 optionally includes a transmit filter module. The power amplifier 310 amplifies the RF signal 312 to produce transmit signal 314 which may be filtered by a transmitter filter module, if included. The transmit signal 314 is coupled along a transmit path from the power amplifier 310 to the antenna section 272 or 272' for transmission to a remote communication device that optionally includes duplexer and/or transmit/receive switch 320.

The power management unit 295 generates a supply voltage 316 to power the power amplifier 310. In operation, the PMU 295 sets and adjusts the supply voltage 316 based on an average power tracking signal 302. The processing module 225 adjusts the average power tracking signal 302 based on a desired power level 308 and further based on a desired linearity in order to, minimize or otherwise reduce the power consumption by the power amplifier 310 while maintaining the linearity of the transmit signal 314.

Consider the operation of processing module 225 in accordance with a first mode of operation without antenna impedance feedback. In this case, the processing module 225 includes a look-up table 306 that stores values of APT signal 302 that are chosen for each desired power level 308 as the value that generates a supply voltage 316 that meets or exceeds a desired specification of linearity. The specification of linearity can be an adjacent channel leakage ratio, a measure of harmonic distortion, or other measure of the clipping or saturation of power amplifier 310. As discussed in conjunction with FIG. 1, the PA 310 is designed to operate under a certain load impedance to guarantee its best performance. However, under antenna impedance mismatch (caused by, for example, a person touching the phone or other objects in close proximity to the antenna), the power amplifier's performance (delivered power, efficiency, linearity) can be significantly degraded. In an embodiment, the APT signal 302 is chosen to meet the linearity specifications over a range of possible antenna impedances that could occur, such as to compensate for a worst case VSWR, expected maximum VSWR, or other expected conditions.

In another mode of operation, the processing module 225 utilizes feedback provided by the directional coupler 330 and one or more envelope detectors, such as envelope detectors 340 and 350 to measure impedance mismatch conditions and to adjust the APT signal 302 to set the supply voltage 316 for the PA 310 to compensate for actual impedance conditions to maintain linearity. This approach can save power over the prior approach by compensating for actual antenna mismatch conditions rather than setting the APT signal 302 to compensate for the worst case mismatch conditions that may or may not be present. In particular, under favorable mismatch conditions where the power amplifier 310 is operating under a desirable load impedance, the APT signal 302 can command the PMU 295 to generate a lower supply voltage 316 and still maintain desired linearity.

In accordance with this mode of operation, the directional coupler 330 is coupled in the transmit path between the power amplifier 310 and the antenna section 272 or 272'. The directional coupler 330 can be a bidirectional coupler or other directional coupler that generates a reflected power signal 334 that indicates a reflected power, Pr, caused by reflections of the transmit signal 314 due to a potential impedance mismatch in the antenna section 272 or 272'. While the directional coupler 330 is shown at a particular point in the transmit path immediately adjacent to the antenna or antenna section 272 or 272', in other embodiments, the directional coupler 330 can be connected at the output of the power amplifier 310 or at another point along the transmit path.

The envelope detector 350 captures the magnitude of the reflected power signal 334 to generate a reflected power voltage that indicates the reflected power, Pr. The processing module 225 can then adjust the average power tracking signal 302 based on Pr to adapt to the impedance mismatch.

As shown further, the directional coupler 330 is further configurable to generate a forward power signal 332 that indicates a forward power, Pf, to the antenna section 272 or 272' in response to the transmit signal 314. The second envelope detector 340 can operate in a similar fashion to envelope detector 350 to generate a forward power voltage that indicates the forward power, Pf. In this case, the processing module 225 can further adjust the average power tracking signal 302 based on forward power indicated by the forward power voltage. In particular, the values of Pf and Pr and be used to generate a voltage standing wave ratio (VSWR) that indicates the amount of impedance mismatch. However, because the RF signal 312 is generated by the RF transmitter itself and the desired power level 308 is known, a measurement of Pr can be sufficient to estimate the actual VSWR and the value of Pf need not necessarily be measured. In either case, the LUT 306 of processing module 225 selects the APT signal 302 based on the desired power level 308 and further in response to the measured values of Pr and/or Pf to maintain a desired linearity in response to actual conditions.

Consider the following example where an ACLR of −30 dB is specified. Optimal APT signals 302 are determined for each possible VSWR magnitude to maintain at least a −30 dB ACLR. The reflected power, Pr, is determined for each possible VSWR as a function of the desired power level 308, and used to populate LUT 306 with APT signals 302 as a function of Pr and desired power level 308 to maintain a −30 dB ACLR. In operation, the processing module 225 adjusts the APT signal 302 based on Pr indicated by reflected power signal 334 and desired power level 308.

Figure 4:
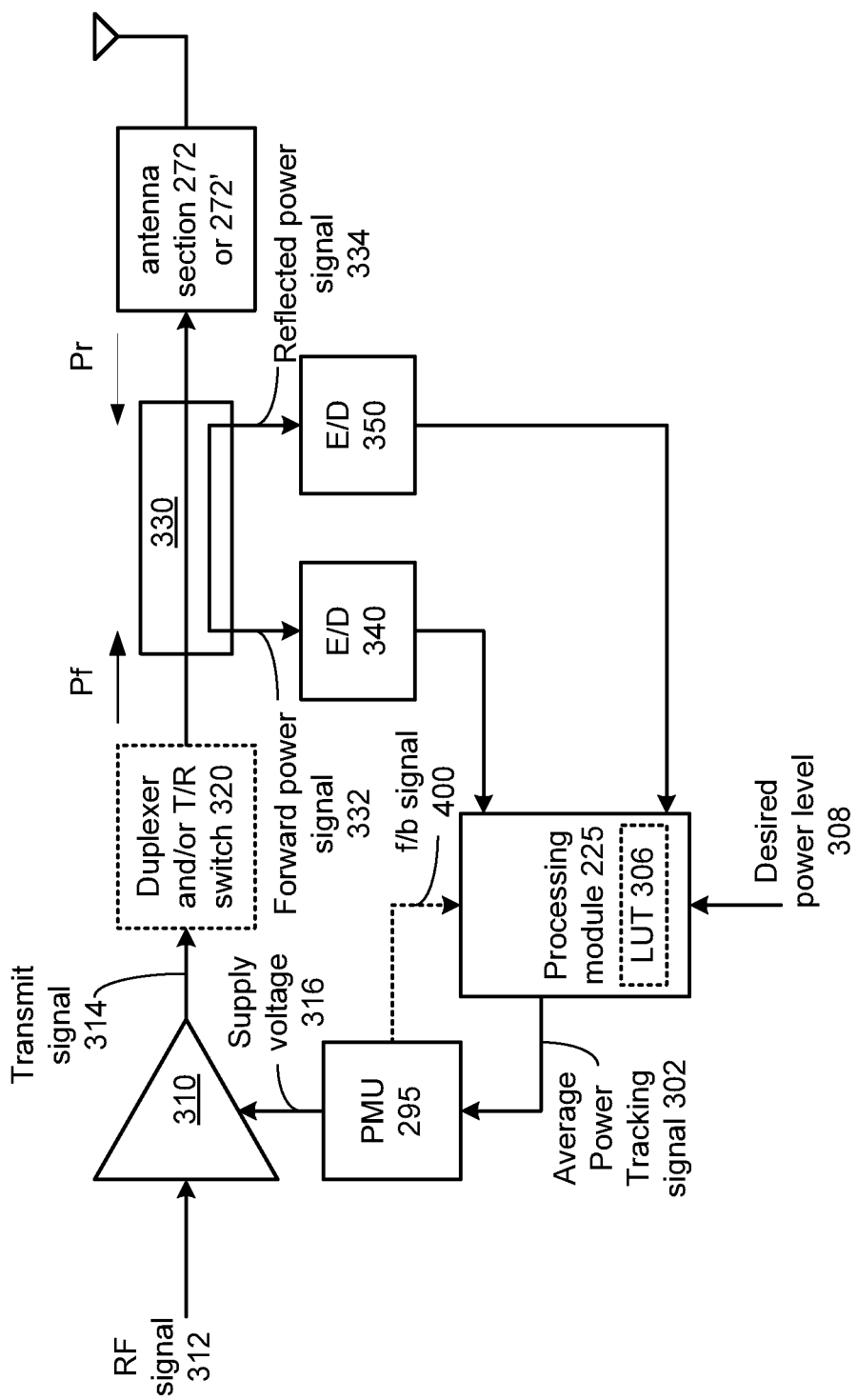
FIG. 4 is a schematic block diagram of another embodiment of an RF transmitter.

FIG. 4 is a schematic block diagram of another embodiment of an RF transmitter. In particular, the RF transmitter includes similar elements presented in conjunction with FIG. 3 that are represented by common reference numerals. In addition, a feedback signal 400 is provided by power management unit 295 to the processing module 225.

In an embodiment, the processing module 225 receives a feedback signal 400 from the power management unit 295 that indicates a power amplifier current consumed by power amplifier 310. While monitoring the Pr and/or Pf via envelope detectors 340 and 350 provides a measurement of the magnitude of the VSWR, no phase information is present. Providing the power amplifier current as feedback signal 400, along with Pr and/or Pf provides enough information to determine the magnitude and phase of the VSWR or impedance mismatch.

In operation, the processing module 225 adjusts the average power tracking signal 302 based not only on the other parameters previously described, but also based on the power amplifier current indicated by the feedback signal 400. In particular, the look-up table 306 generates APT signal 302 as a function of desired power level 308, power amplifier current, reflected power and optionally forward power as well.

Figure 5:
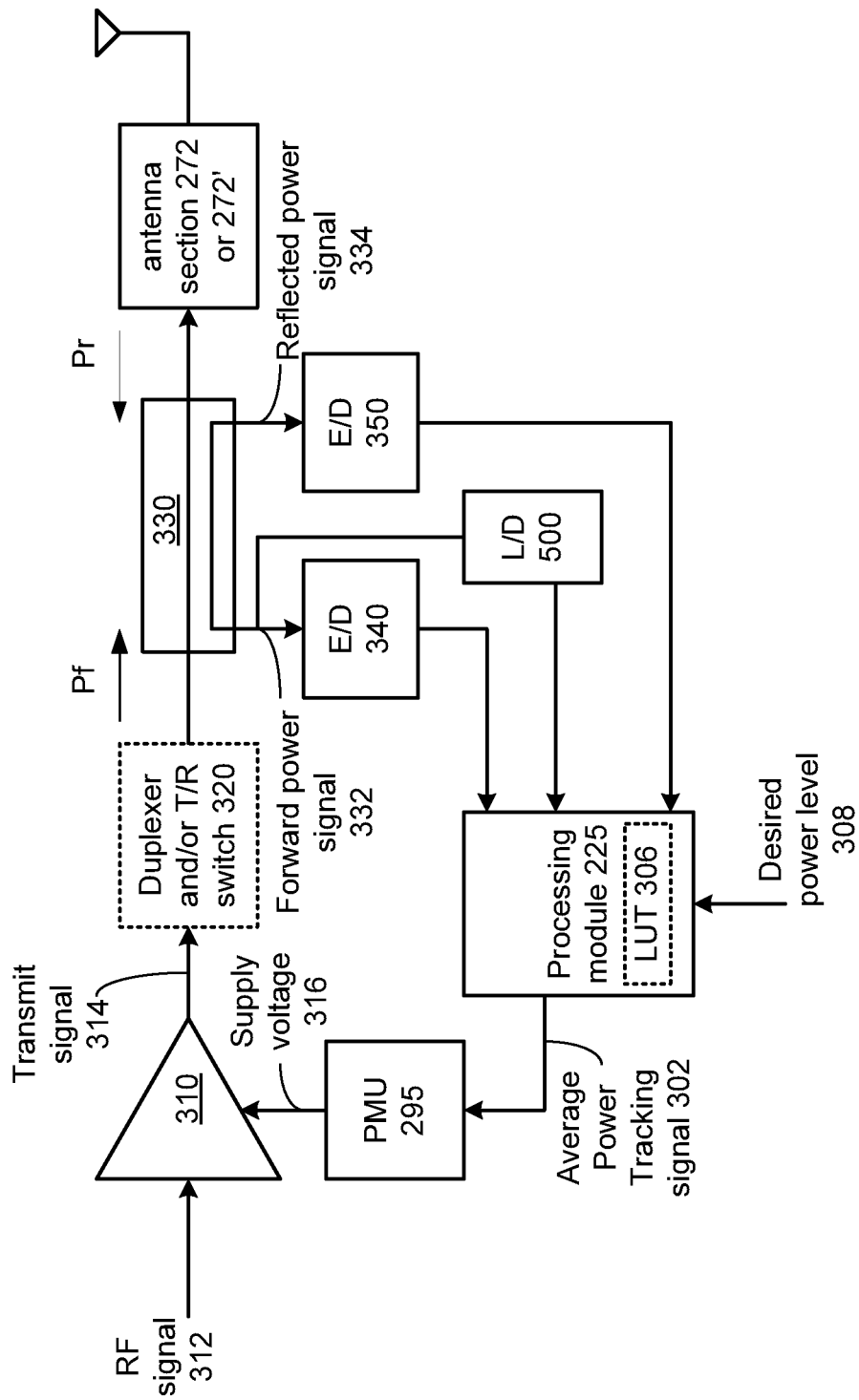
FIG. 5 is a schematic block diagram of another embodiment of an RF transmitter.

FIG. 5 is a schematic block diagram of another embodiment of an RF transmitter. In particular, the RF transmitter includes similar elements presented in conjunction with FIG. 3 that are represented by common reference numerals. In addition, a linearity detector 500 provides an indication of linearity, such as a measurement of ACLR, to the processing module 225.

In an example, the linearity detector 500 analyzes the forward power signal 332 to determine a measurement of linearity. In an embodiment, the linearity detector 500 includes a first filter tuned to an adjacent channel and a first envelope detector provides a voltage in proportion to the magnitude of the adjacent channel power. A second filter tuned to the primary channel and second envelope detector provides a voltage in proportion to the magnitude of the primary channel power. The processing module 225 analyzes these two voltages to determine ACLR as a ratio of the primary channel power to the adjacent channel power. While linearity detector 500 is described above as providing a measurement of ACLR, other measurements of linearity such as a measurement of adjacent channel leakage, a distortion or other measurement circuits for determining ACLR can likewise be employed. Further, while the linearity detector is described as operating based on forward power signal 332, other signals in the transmit path such as reflected power signal 334, transmit signal 314 can be analyzed to generate a measurement of linearity as well.

In an embodiment, the processing module 225 receives the measurement of linearity from the linearity detector 500. While monitoring the Pr and/or Pf via envelope detectors 340 and 350 provides a measurement of the magnitude of the VSWR, no phase information is present. Providing the measurement of linearity from the linearity detector 500, along with Pr and/or Pf provides enough information to determine the magnitude and phase of the VSWR or impedance mismatch.

In operation, the processing module 225 adjusts the average power tracking signal 302 based not only on the other parameters previously described, but also based on the measurement of linearity from the linearity detector 500. In particular, the look-up table 306 generates APT signal 302 as a function of desired power level 308, the linearity measurement, reflected power and optionally forward power as well.

Figure 6:
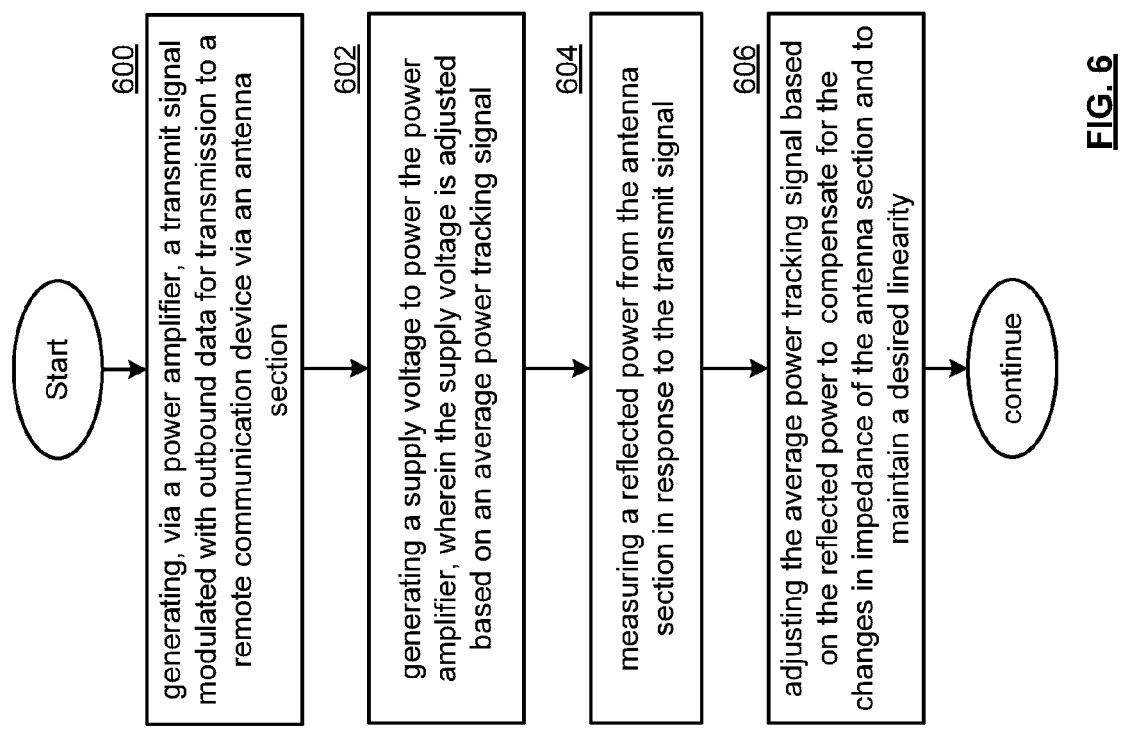
FIG. 6 is a flow diagram of an embodiment of a method.

FIG. 6 is a flow diagram of an embodiment of a method. In particular, a method is presented for use in conjunction with the functions and features described in conjunction with FIGS. 1-5. Step 600 includes generating, via a power amplifier, a transmit signal modulated with outbound data for transmission to a remote communication device via an antenna section. Step 602 includes generating a supply voltage to power the power amplifier, wherein the supply voltage is adjusted based on an average power tracking signal. Step 604 includes measuring a reflected power from the antenna section in response to the transmit signal. Step 606 includes adjusting the average power tracking signal based on the reflected power to compensate for the changes in impedance of the antenna section and to maintain a desired linearity.

As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may also be used herein, the terms "processing module", "module", "processing circuit", and/or "processing unit" (e.g., including various modules and/or circuitries such as may be operative, implemented, and/or for encoding, for decoding, for baseband processing, etc.) may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may have an associated memory and/or an integrated memory element, which may be a single memory device, a plurality of memory devices, and/or embedded circuitry of the processing module, module, processing circuit, and/or processing unit. Such a memory device may be a read-only memory (ROM), random access memory (RAM), volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

Various embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

A physical embodiment of an apparatus, an article of manufacture, a machine, and/or of a process that includes one or more embodiments may include one or more of the aspects, features, concepts, examples, etc. described with herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

The term "module" is used in the description of the various. A module includes a functional block that is implemented via hardware to perform one or module functions such as the processing of one or more input signals to produce one or more output signals. The hardware that implements the module may itself operate in conjunction software, and/or firmware. As used herein, a module may contain one or more sub-modules that themselves are modules.

While particular combinations of various options, methods, functions and features have been expressly described herein, other combinations of these options, methods, functions and features are likewise possible. The various embodiments are not limited by the particular examples disclosed herein and expressly incorporates these other combinations.

What is claimed is:

1. A radio frequency (RF) transmitter comprising:
   an power amplifier operable to generate a transmit signal modulated with outbound data for transmission to a remote communication device via an antenna section;
   a power management unit, coupled to the power amplifier, that generates a supply voltage to power the power amplifier, wherein the supply voltage is set by the power management unit based on an average power tracking signal;
   a processing module, coupled to the power management unit, that adjusts the average power tracking signal based on a desired power level and further based on a desired linearity;
   a directional coupler, coupled in a transmit path between the power amplifier and the antenna section, configurable to generate a reflected power signal that indicates a reflected power from the antenna section in response to the transmit signal;
   a first envelope detector, coupled to the directional coupler and the processing module, configurable to generate a reflected power voltage that indicates the reflected power; and
   wherein the processing module further adjusts the average power tracking signal based on reflected power indicated by the reflected power voltage.

2. The RF transmitter of claim 1 wherein the processing module adjusts the average power tracking signal based on the reflected power voltage to compensate for changes in impedance of the antenna section and to maintain the desired linearity.

3. The RF transmitter of claim 1 wherein the directional coupler is further configurable to generate a forward power signal that indicates a forward power to the antenna section in response to the transmit signal and wherein the RF transmitter further comprises:
   a second envelope detector, coupled to the directional coupler and the processing module, configurable to generate a forward power voltage that indicates the forward power;
   wherein the processing module further adjusts the average power tracking signal based on the forward power indicated by the forward power voltage.

4. The RF transmitter of claim 1 further comprising a non-linearity detector, coupled to the directional coupler, configurable to generate at least one non-linearity voltage that indicates an adjacent channel leakage ratio and wherein the processing module further adjusts the average power tracking signal based on the adjacent channel leakage ratio indicated by the at least one non-linearity voltage.

5. The RF transmitter of claim 1 wherein the transmit path includes a duplexer and the directional coupler is coupled in the transmit path between the duplexer and the antenna section.

6. The RF transmitter of claim 1 wherein the transmit path includes a transmit/receive switch and the directional coupler is coupled in the transmit path between the transmit/receive switch and the antenna section.

7. The RF transmitter of claim 1 wherein the processing module includes a look-up table and generates the average power tracking signal from the look-up table to maintain the desired linearity.

8. The RF transmitter of claim 1 wherein the processing module receives a feedback signal from the power management unit that indicates a power amplifier current and wherein the processing module further adjusts the average power tracking signal based on the power amplifier current.

9. The RF transmitter of claim 1 wherein the antenna section includes an impedance matching network and at least one antenna.

10. A radio frequency (RF) transmitter comprising:
    an power amplifier operable to generate a transmit signal modulated with outbound data for transmission to a remote communication device via an antenna section;
    a power management unit, coupled to the power amplifier, that generates a supply voltage to power the power amplifier, wherein the supply voltage is set by the power management unit based on an average power tracking signal;
    a directional coupler, coupled in a transmit path between the power amplifier and the antenna section, configurable to generate a reflected power signal that indicates a reflected power from the antenna section in response to the transmit signal;
    a first envelope detector, coupled to the directional coupler, configurable to generate a reflected power voltage that indicates the reflected power; and
    a processing module, coupled to the power management unit, that adjusts the average power tracking signal based on the reflected power indicated by the reflected power voltage and further based on a desired linearity.

11. The RF transmitter of claim 10 wherein the processing module includes a look-up table and generates the average power tracking signal from the look-up table to maintain the desired linearity.

12. The RF transmitter of claim 10 wherein the processing module adjusts the average power tracking signal based on the reflected power voltage to compensate for changes in impedance of the antenna section and to maintain the desired linearity.

13. The RF transmitter of claim 10 wherein the directional coupler is further configurable to generate a forward power signal that indicates a forward power to the antenna section in response to the transmit signal and wherein the RF transmitter further comprises:
    a second envelope detector, coupled to the directional coupler and the processing module, configurable to generate a forward power voltage that indicates the forward power;

wherein the processing module further adjusts the average power tracking signal based on the forward power indicated by the forward power voltage.

14. The RF transmitter of claim 10 further comprising a non-linearity detector, coupled to the directional coupler, configurable to generate at least one non-linearity voltage that indicates an adjacent channel leakage ratio and wherein the processing module further adjusts the average power tracking signal based on the adjacent channel leakage ratio indicated by the at least one non-linearity voltage.

15. The RF transmitter of claim 10 wherein the transmit path includes a duplexer and the directional coupler is coupled in the transmit path between the duplexer and the antenna section.

16. The RF transmitter of claim 10 wherein the transmit path includes a transmit/receive switch and the directional coupler is coupled in the transmit path between the transmit/receive switch and the antenna section.

17. The RF transmitter of claim 10 wherein the processing module receives a feedback signal from the power management unit that indicates a power amplifier current and wherein the processing module further adjusts the average power tracking signal based on the power amplifier current.

18. The RF transmitter of claim 10 wherein the antenna section includes an impedance matching network and at least one antenna.

19. A method comprising:

generating, via a power amplifier, a transmit signal modulated with outbound data for transmission to a remote communication device via an antenna section;

generating a supply voltage to power the power amplifier, wherein the supply voltage is adjusted based on an average power tracking signal;

measuring, by a directional coupler coupled in a transmit path between the power amplifier and the antenna section, a reflected power from the antenna section in response to the transmit signal;

generating by a first envelope detector, a reflected power voltage that indicates the reflected power; and adjusting the average power tracking signal based on the reflected power indicated by the reflected power voltage to compensate for changes in impedance of the antenna section and to maintain a desired linearity.

20. The method of claim 19 further comprising:

generating a forward power signal that indicates a forward power to the antenna section in response to the transmit signal; and generating a forward power voltage that indicates the forward power;

wherein the average power tracking signal is adjusted further based on the forward power indicated by the forward power voltage.

* * * * *